United States Patent
Tsurunari et al.

(10) Patent No.: US 9,083,314 B2
(45) Date of Patent: Jul. 14, 2015

(54) ELASTIC WAVE FILTER DEVICE AND ANTENNA DUPLEXER USING SAME

(75) Inventors: Tetsuya Tsurunari, Osaka (JP); Joji Fujiwara, Osaka (JP); Hiroyuki Nakamura, Osaka (JP)

(73) Assignee: SKYWORKS PANASONIC FILTER SOLUTIONS JAPAN CO., LTD., Osaka (JP)

( * ) Notice: Subject to any disclaimer, the term of this patent is extended or adjusted under 35 U.S.C. 154(b) by 341 days.

(21) Appl. No.: 13/509,641

(22) PCT Filed: Nov. 10, 2010

(86) PCT No.: PCT/JP2010/006585
§ 371 (c)(1),
(2), (4) Date: May 14, 2012

(87) PCT Pub. No.: WO2011/061904
PCT Pub. Date: May 26, 2011

(65) Prior Publication Data
US 2012/0313724 A1    Dec. 13, 2012

(30) Foreign Application Priority Data

Nov. 19, 2009    (JP) .................................. 2009-263717

(51) Int. Cl.
*H03H 9/64*    (2006.01)
*H03H 9/72*    (2006.01)

(52) U.S. Cl.
CPC .................................... *H03H 9/725* (2013.01)

(58) Field of Classification Search
CPC ............ H03H 9/145; H03H 9/64; H03H 9/72
USPC ......................................... 333/133, 193–196
See application file for complete search history.

(56) References Cited

U.S. PATENT DOCUMENTS

| | | | |
|---|---|---|---|
| 5,521,453 A | 5/1996 | Yatsuda | |
| 5,592,135 A * | 1/1997 | Taguchi et al. | 333/193 |
| 7,583,161 B2 * | 9/2009 | Tanaka | 333/133 |
| 7,609,129 B2 * | 10/2009 | Yokota et al. | 333/133 |
| 7,733,196 B2 * | 6/2010 | Tsurunari et al. | 333/133 |

(Continued)

FOREIGN PATENT DOCUMENTS

| | | |
|---|---|---|
| CN | 1351418 A | 5/2002 |
| EP | 1976118 A1 | 10/2008 |

(Continued)

OTHER PUBLICATIONS

International Application Serial No. PCT/JP2010/006585, International Search Report mailed Jan. 25, 2011, 1 pg.

(Continued)

*Primary Examiner* — Dean Takaoka
*Assistant Examiner* — Alan Wong
(74) *Attorney, Agent, or Firm* — Lando & Anastasi, LLP (57) ABSTRACT

An elastic wave filter device includes a longitudinally coupled resonator-type elastic wave filter formed on a piezoelectric substrate; and a ladder-type elastic wave filter connected to the resonator-type elastic wave filter. The resonator-type filter includes an input IDT and an output IDT. The ladder-type filter includes a series arm resonator and a parallel arm resonator. A first ground electrode connected to the parallel arm resonator is electrically separated from a second ground electrode connected to at least one of the input IDT and the output IDT.

20 Claims, 8 Drawing Sheets

(56) References Cited

U.S. PATENT DOCUMENTS

| | | | |
|---|---|---|---|
| 8,179,211 B2 * | 5/2012 | Bauer et al. | 333/193 |
| 2002/0074899 A1 | 6/2002 | Nakao et al. | |
| 2004/0093705 A1 | 5/2004 | Nakao et al. | |
| 2008/0266023 A1 | 10/2008 | Tanaka | |
| 2008/0284540 A1 | 11/2008 | Nishihara | |
| 2009/0009263 A1 | 1/2009 | Javid | |

FOREIGN PATENT DOCUMENTS

| | | |
|---|---|---|
| JP | 07131290 A | 5/1995 |
| JP | 2008533779 A | 8/2008 |
| JP | 2008271230 A | 11/2008 |
| WO | WO-2006094569 A1 | 9/2006 |
| WO | WO 2007006375 A1 * | 1/2007 |
| WO | WO 2007/083432 A1 | 7/2007 |
| WO | WO-2007083432 A1 | 7/2007 |

OTHER PUBLICATIONS

Chinese Search Report for Application No. 201080050454, dated Feb. 25, 2014.

* cited by examiner

ELASTIC WAVE FILTER DEVICE AND ANTENNA DUPLEXER USING SAME

This application is a U.S. National Phase Application of PCT International Application PCT/JP2010/006585.

TECHNICAL FIELD

The present invention relates to an elastic wave filter device mainly used for mobile communication equipment and to an antenna duplexer using the elastic wave filter.

BACKGROUND ART

Figure 11:
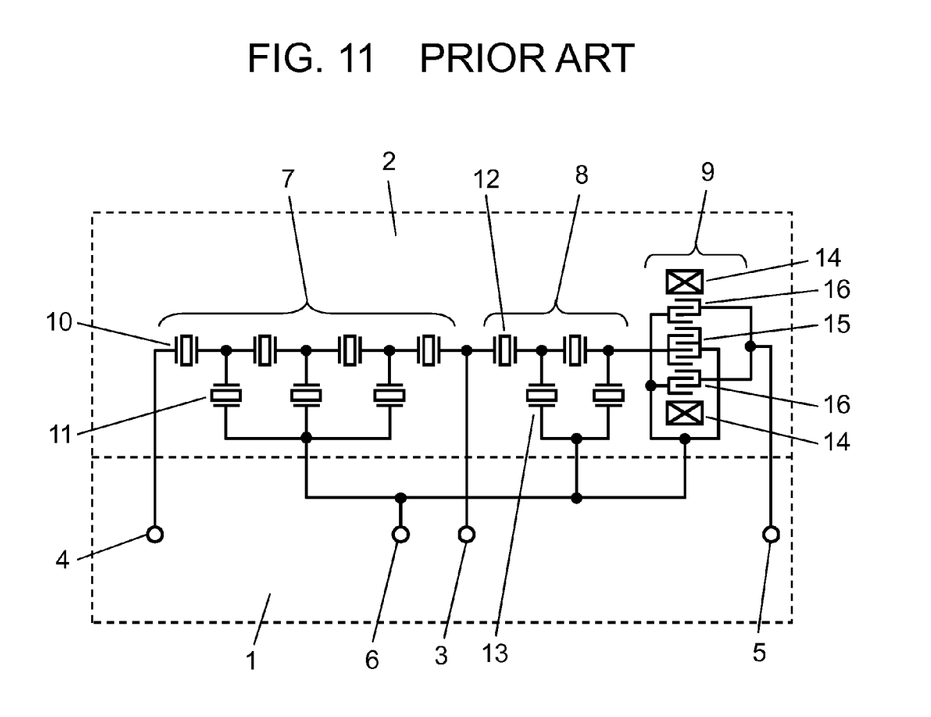
FIG. 11 is a circuit diagram of a conventional elastic wave filter device.

In recent years, antenna duplexers have been widely used that separate transmitting waves and receiving waves using an elastic wave filter device in the antenna circuit of a mobile phone. FIG. 11 is a circuit diagram of a conventional elastic wave filter device. The device includes panel 1 made of a ceramic substrate and chip 2 attached onto panel 1. Panel 1 includes common terminal 3, transmission-side terminal 4, receiving-side terminal 5, ground electrode 6, and wirings connecting these terminals. Chip 2 made of a single-crystal piezoelectric substrate, includes, on its surface, first ladder-type elastic wave filter 7 forming the transmission-side filter; and second ladder-type elastic wave filter 8 and longitudinally coupled resonator-type elastic wave filter 9 both forming the receiving-side filter. Filters 7, 8, and 9 are formed of elastic wave elements (not shown).

First ladder-type elastic wave filter 7 includes series arm resonator 10 and parallel arm resonator 11. One end of filter 7 is connected to common terminal 3, and the other end is connected to transmission-side terminal 4. The ground-side wiring of parallel arm resonator 11 is connected to ground electrode 6.

Second ladder-type elastic wave filter 8 and longitudinally coupled resonator-type elastic wave filter 9 are serially connected to between common terminal 3 and receiving-side terminal 5. Filter 8 includes series arm resonator 12 and parallel arm resonator 13, and the ground-side wiring of resonator 13 is connected to ground electrode 6. Filter 9 includes input IDT (inter-digital transducer) 15 and output IDT 16 between reflectors 14. Each one end of input IDT 15 and output IDT 16 is connected to the signal wiring, and the other end is connected to ground electrode 6.

The above elastic wave filter device is used as a high-frequency filter with its passband center frequency between around 800 MHz to 2 GHz in mobile communication equipment. One of the important required characteristics in this case is to reduce unnecessary signals; increasing the attenuation is demanded at frequencies out of the passband.

However, even if the electrode finger pattern of an IDT is optimized to increase attenuation of the elastic wave element itself out of the band, an elastic wave filter device that is a product finished by containing the elastic wave elements into a package (not shown) may exhibit degradation in out-of-band attenuation. Reasons for the problem include an electrode wiring pattern inside the package and presence of electric resistance in the conductive material electrically connecting the package with the elastic wave element. The other reason is various types of parasitic components generated (e.g. presence of parasitic inductance and floating capacitance, electromagnetic coupling between input IDT 15 and output IDT 16; and between input IDT 15 or output IDT 16 and ground electrode 6). Consequently, an elastic wave filter device produced by packaging elastic wave elements often exhibits high-frequency characteristics lower than those achieved by a single elastic wave element. Further, out-of-band noise components released from parallel arm resonator 11 of first ladder-type elastic wave filter 7 to ground electrode 6 sometimes flow from ground electrode 6 into the signal wiring through input IDT 15 or output IDT 16 of filter 9, degrading the attenuation characteristics.

There is known patent literature 1 for example as information on prior art documents related to the invention of the application.

CITATION LIST

Patent Literature

PTL 1 Japanese Patent Unexamined Publication No. H07-131290

SUMMARY OF THE INVENTION

An elastic wave filter device of the present invention includes a longitudinally coupled resonator-type elastic wave filter formed on a piezoelectric substrate; and a ladder-type elastic wave filter formed on the same piezoelectric substrate, connected to the resonator-type filter. The resonator-type filter includes an input IDT and an output IDT; the ladder-type filter includes a series arm resonator and a parallel arm resonator. A first ground electrode connected to the parallel arm resonator is electrically separated from a second ground electrode connected to at least one of the input IDT and the output IDT.

This configuration prevents influence of noise components passing through the ground electrode, thereby providing favorable filter characteristics.

An antenna duplexer of the present invention uses elastic wave filter devices of the present invention as the transmission filter and the receiving filter, and shares the antenna terminal. This configuration allows increasing the isolation characteristics.

DESCRIPTION OF EMBODIMENTS

First Exemplary Embodiment

Figure 1:
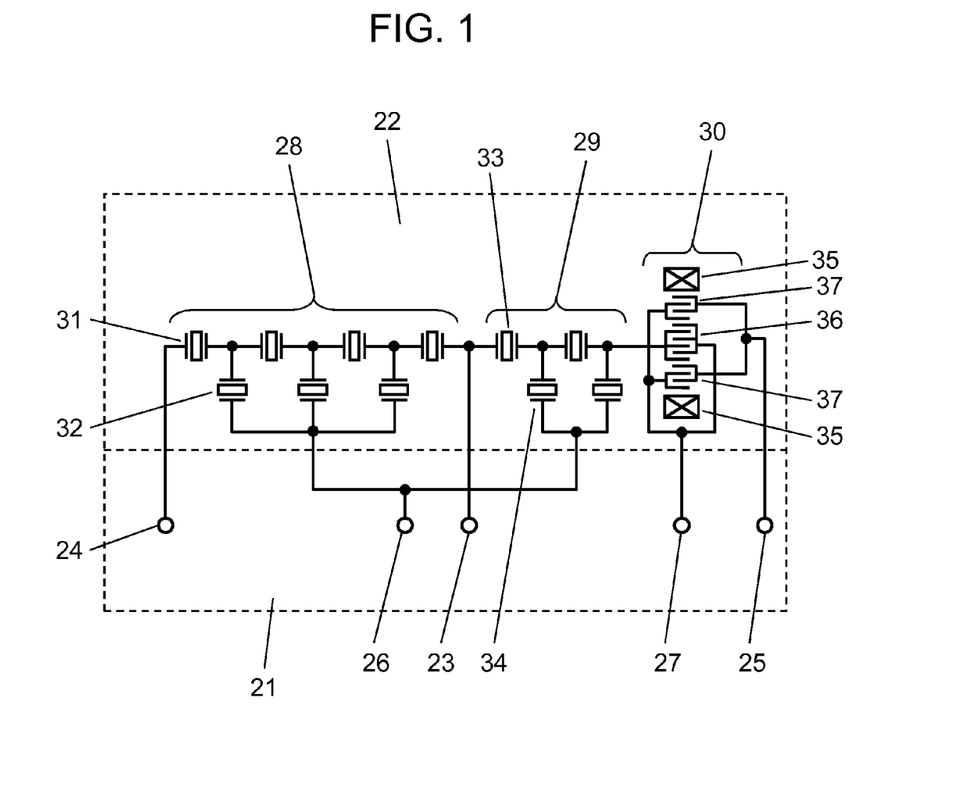
FIG. 1 is a circuit diagram of an elastic wave filter device according to the first exemplary embodiment of the present invention.

FIG. 1 is a circuit diagram of an elastic wave filter device according to the first exemplary embodiment of the present invention. The elastic wave filter device includes panel 21 made of a ceramic substrate; and chip 22 made of a single-crystal piezoelectric substrate, attached onto panel 21. Panel 21 includes common terminal 23, transmission-side terminal 24, receiving-side terminal 25, first ground electrode 26, second ground electrode 27, and wirings connecting these terminals and electrodes. Chip 22 includes, on its surface, first ladder-type elastic wave filter 28 forming the transmission-side filter;

and second ladder-type elastic wave filter 29 and longitudinally coupled resonator-type elastic wave filter 30 both forming the receiving-side filter. Filters 28, 29, and 30 are formed of elastic wave elements (not shown).

Filter 28 includes series arm resonator 31 and parallel arm resonator 32. One end of filter 28 is connected to common terminal 23, and the other end is connected to transmission-side terminal 24. The ground-side wiring of resonator 32 is connected to first ground electrode 26.

Filters 29 and 30 are serially connected to between common terminal 23 and receiving-side terminal 25. Filter 29 includes series arm resonator 33 and parallel arm resonator 34, and the ground-side wiring of resonator 34 is connected to first ground electrode 26. Filter 30, which is of imbalance-input and imbalance-output type, includes input IDT 36 and output IDT 37 between reflectors 35. Each one end of input IDT 36 and output IDT 37 is connected to the signal wiring, and the other end is connected to second ground electrode 27.

As shown in FIG. 1, electrodes 26 and 27 are electrically separated from each other above the piezoelectric substrate. Electrode 27 is connected to input IDT 36 and output IDT 37 of filter 30. Electrode 26 is connected to resonator 32 of filter 28 and to resonator 34 of filter 29.

Figure 2A:
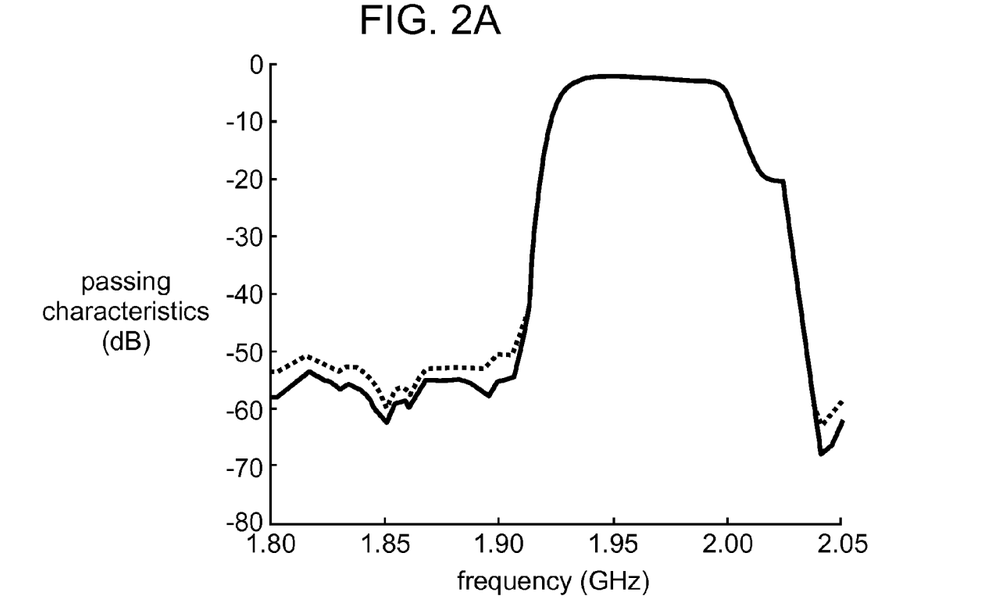
FIG. 2A is a passing characteristic diagram of the receiving-side filter of the elastic wave filter device.
Figure 2B:
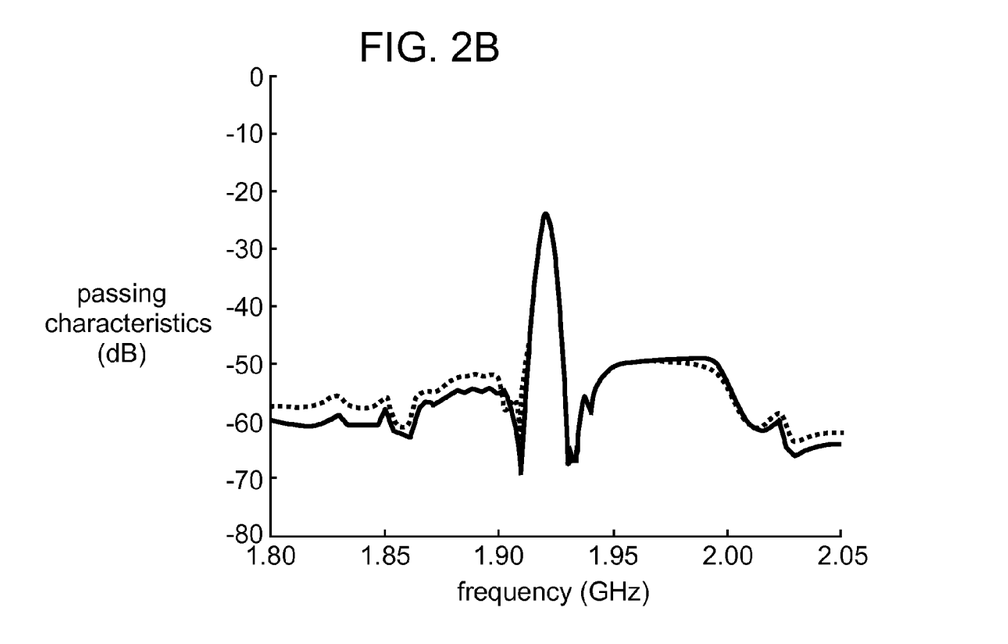
FIG. 2B is a passing characteristic diagram showing isolation of the elastic wave filter device.

Next, a passing characteristic diagram of the elastic wave filter device according to the embodiment is shown in FIGS. 2A and 2B. In FIG. 2A, the solid line represents the passing characteristics of the receiving-side filter of the device. The broken line in FIG. 2A is a comparative example, representing the passing characteristics of the receiving-side filter in a case where electrodes 26 and 27 are electrically connected to each other above the piezoelectric substrate in FIG. 1. As shown in FIG. 2A, the passing characteristics of the receiving-side filter are improved by approximately 2 to 4 dB in attenuation in the passing frequency band of the receiving-side filter of 1.85 to 1.91 GHz as compared to the comparative example.

The solid line in FIG. 2B represents passing characteristics showing isolation between the transmission- and receiving-side filters in the device. The broken line in FIG. 2B represents passing characteristics showing isolation between the transmission- and receiving-side filters in a case where electrodes 26 and 27 are electrically connected to each other above the piezoelectric substrate in FIG. 1. As shown in FIG. 2B, the passing characteristics showing isolation between the transmission- and receiving-side filters in the device are improved as compared to the comparative example, by approximately 4 dB in attenuation particularly in the passing frequency band of the receiving-side filter of 1.85 to 1.91 GHz.

As described above, in the elastic wave filter device according to the embodiment, first ground electrode 26 and second ground electrode 27 are electrically separated from each other in the circuit formed by connecting ladder-type elastic wave filters 28 and 29 and longitudinally coupled resonator-type elastic wave filter 30. In other words, the ground side of parallel arm resonators 32 and 34 is electrically separated from the ground side of input IDT 36 and output IDT 37.

As a result, out-of-band noise components released from parallel arm resonators 32 and 34 of filters 28 and 29 to first ground electrode 26 can be prevented from flowing into the signal wiring through input IDT 36 or output IDT 37 of filter 30. This improves the attenuation characteristics of filter 30.

Here, at least one of the ground side of input IDT 36 and that of output IDT 37, of filter 30 may be electrically separated from first ground electrode 26 connected to filters 28 and 29.

Figure 3:
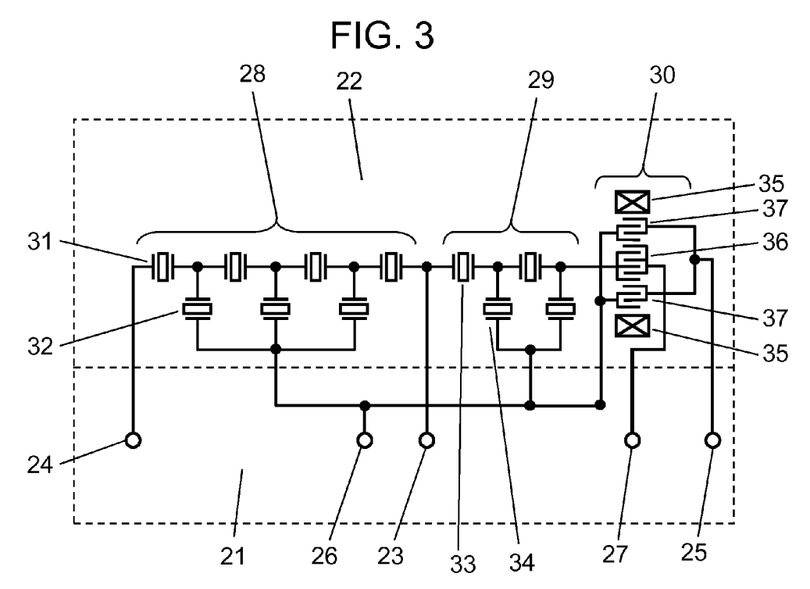
FIG. 3 is a circuit diagram of another elastic wave filter device according to the first embodiment of the present invention.

More specifically, as shown in FIG. 3, the ground side of output IDT 37 may be connected to the ground side of filters 28 and 29, and they may be separated from the ground side of input IDT 36. In this case, out-of-band noise components released to first ground electrode 26 can be prevented from flowing into the signal wiring through input IDT 36 of filter 30.

Figure 4:
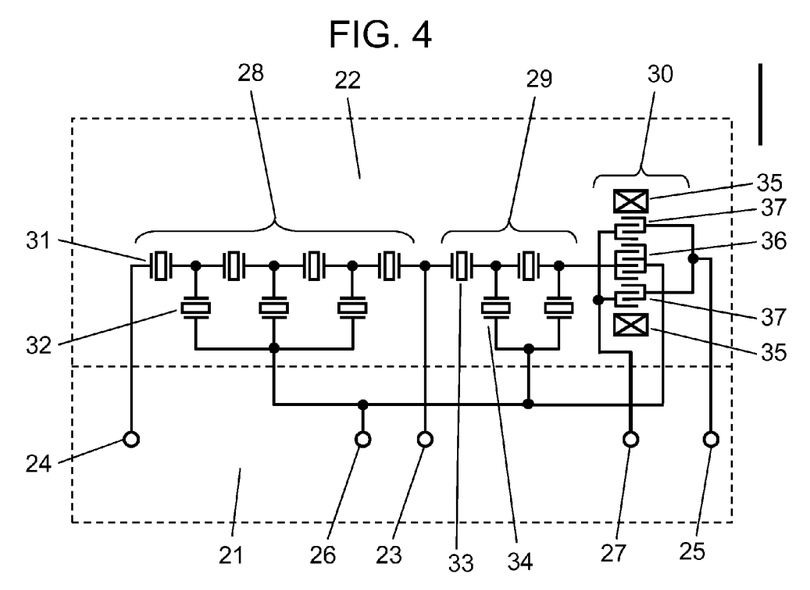
FIG. 4 is a circuit diagram of yet another elastic wave filter device according to the first embodiment of the present invention.

As shown in FIG. 4, the ground side of input IDT 36 may be connected to the ground side of filters 28 and 29, and they may be separated from the ground side of output IDT 37. In this case, out-of-band noise components released to first ground electrode 26 can be prevented from flowing into the signal wiring through output IDT 37 of filter 30.

Consequently, the ground side of input IDT 36 may be separated from that of parallel arm resonators 32 and 34; the ground side of output IDT 37 may be separated from that of parallel arm resonators 32 and 34.

The above-described effect is particularly noticeable when filters 28 and 29 and filter 30 are serially connected to function as one filter circuit, thereby improving the attenuation characteristics of the elastic wave filter device.

The above-described effect is further noticeable when the ground side of filters 28 and 29 is electrically separated from the ground side of filter 30 in the entire elastic wave filter device including panel 21 as well as chip 22. This arrangement further improves the attenuation characteristic of the elastic wave filter device.

Meanwhile, ladder-type elastic wave filters 28 and 29 represent a large fluctuation of their passband and stop band due to influence of parasitic inductors added to parallel arm resonators 32 and 34. Consequently, in the wirings connected to resonators 32 and 34, their ground can be reinforced by being electrically connected to each other using first ground electrode 26, thereby preventing influence of parasitic inductors added to resonators 32 and 34. Accordingly, electrically connecting the ground side of resonators 32 and 34 of filters 28 and 29 allows improving the characteristics of the elastic wave filter device.

Figure 5:
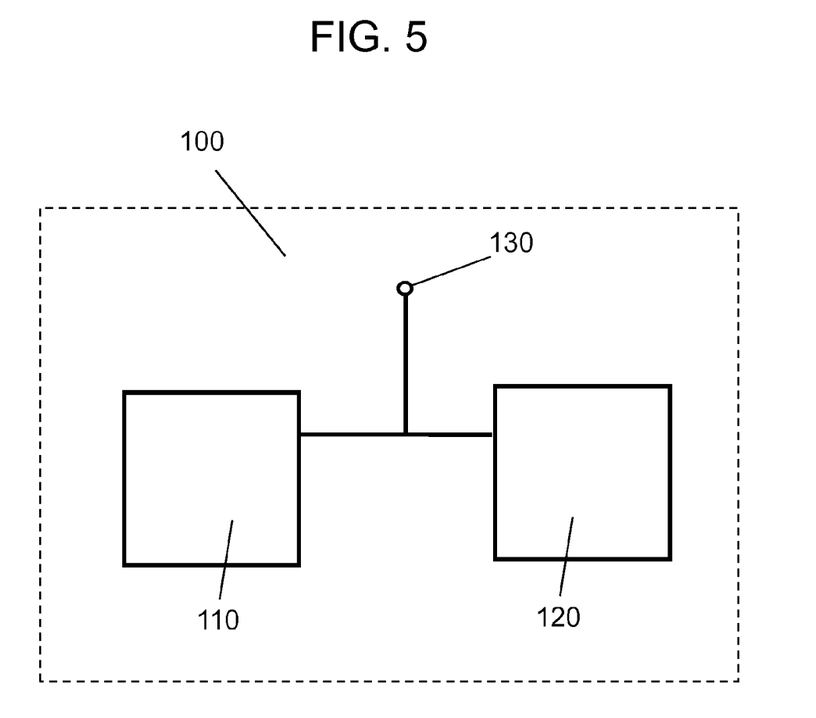
FIG. 5 is a block diagram of an antenna duplexer according to the first embodiment of the present invention.

FIG. 5 is a block diagram of antenna duplexer 100 according to the first exemplary embodiment of the present invention. Antenna duplexer 100 includes an elastic wave filter device of this embodiment as transmission filter 110 and receiving filter 120, and shares antenna terminal 130. Ladder-type elastic wave filters 28 and 29 and longitudinally coupled resonator-type elastic wave filter 30 of this embodiment, applied to antenna duplexer 100, help improve the isolation characteristics between transmission-side filter 110 and receiving-side filter 120.

In this case, preferably the ground side of filter 28 forming the transmission-side filter is electrically connected to the ground side of filter 29 forming a part of the receiving-side filter. This prevents influence of parasitic inductors added to resonators 32 and 34, thereby further improving the characteristics of the elastic wave filter device.

Second Exemplary Embodiment

Figure 6:
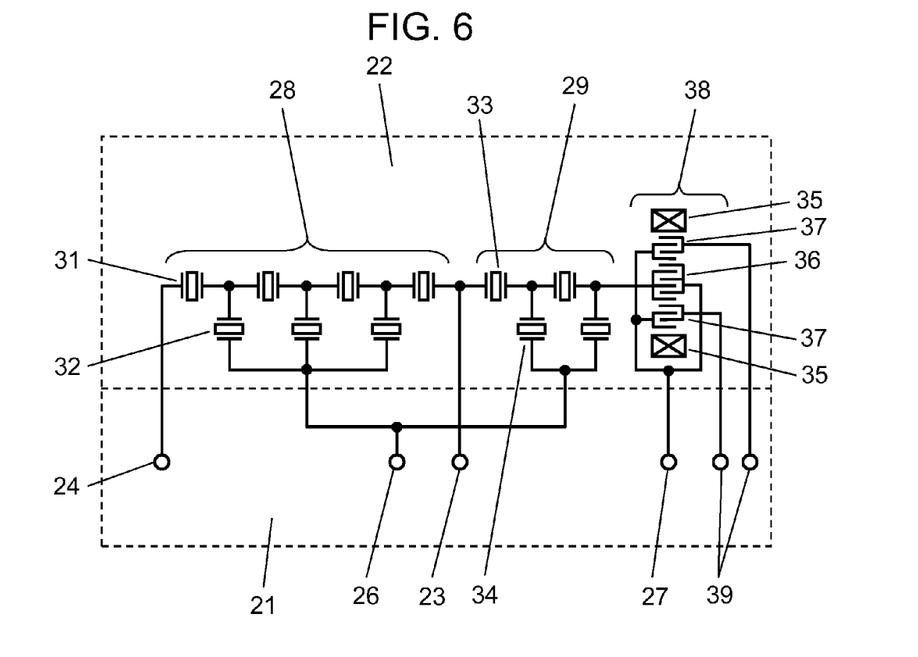
FIG. 6 is a circuit diagram of an elastic wave filter device according to the second exemplary embodiment of the present invention.
Figure 7:
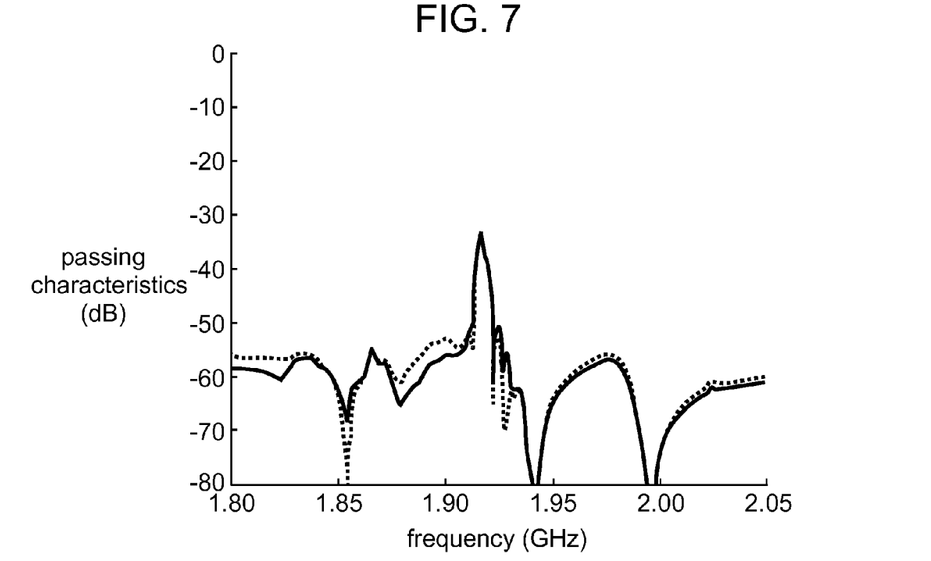
FIG. 7 is a common-mode passing characteristic diagram of the elastic wave filter device.

FIG. 6 is a circuit diagram of an elastic wave filter device according to the second exemplary embodiment of the present invention. FIG. 7 is a common-mode passing characteristic diagram of the device.

In FIG. 6, a component common to that of FIG. 1 is given the same reference mark, and its description is omitted. In this embodiment, longitudinally coupled resonator-type elastic wave filter 38 is of an imbalance/balance conversion type, and receiving-side terminal 39 is formed of a pair of balanced terminals. That is, the elastic wave filter device of this embodiment is formed by connecting ladder-type elastic wave filters 28 and 29 with imbalance/balance conversion type longitudinally coupled resonator-type elastic wave filter 38.

In FIG. 7, the solid line represents the common-mode passing characteristics between receiving-side terminals 39 of the elastic wave filter device of the embodiment. The broken line in FIG. 7 is a comparative example, representing the passing characteristics between receiving-side terminals 39 in a case where first ground electrode 26 and second ground electrode 27 are electrically connected to each other above the piezoelectric substrate in FIG. 6. The passing characteristics between receiving-side terminals 39 are improved as compared to the comparative example, by approximately 2 dB in attenuation particularly in the passing frequency band of the receiving-side filter of 1.85 to 1.91 GHz.

In the elastic wave filter device of the embodiment, first ground electrode 26 and second ground electrode 27 are electrically separated from each other above the piezoelectric substrate, in the circuit formed by connecting filters 28 and 29 with filter 38. In other words, the ground side of parallel arm resonators 32 and 34 and that of input IDT 36 and output IDT 37 are electrically separated from each other.

As a result, out-of-band noise components released from parallel arm resonators 32 and 34 of filters 28 and 29 to first ground electrode 26 can be prevented from flowing into the signal wiring through input IDT 36 or output IDT 37 of filter 38. This improves the common-mode passing characteristics in balanced output of filter 38.

Here, at least one of the ground side of input IDT 36 and that of output IDT 37, of filter 38 may be electrically separated from the ground side connected to filters 28 and 29.

Figure 8:
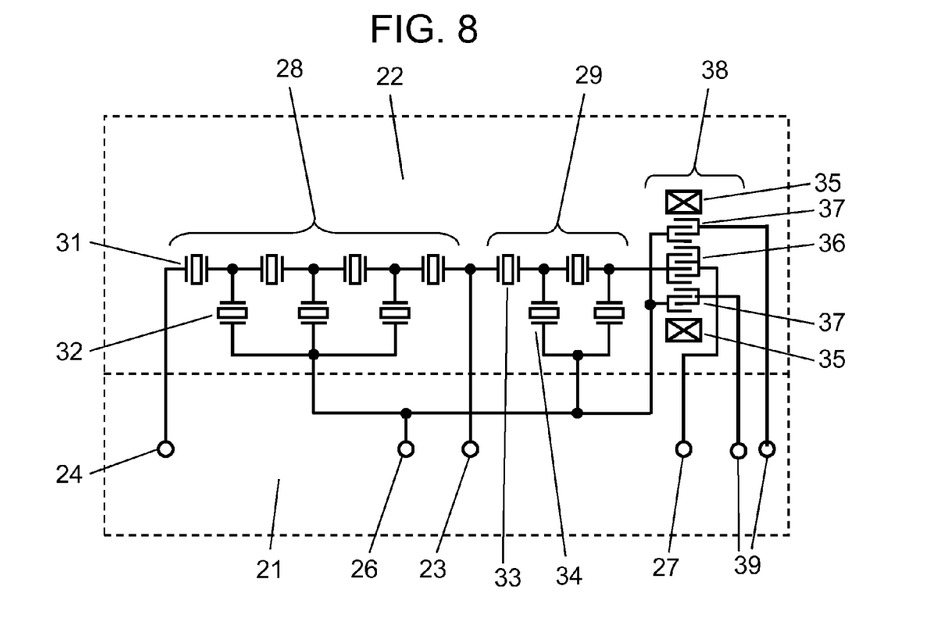
FIG. 8 is a circuit diagram of another elastic wave filter device according to the second embodiment of the present invention.

More specifically, as shown in FIG. 8, the ground side of output IDT 37 may be connected to the ground side of filters 28 and 29, and they may be separated from the ground side of input IDT 36. In this case, out-of-band noise components released to first ground electrode 26 can be prevented from flowing into the signal wiring through input IDT 36 of filter 38.

Figure 9:
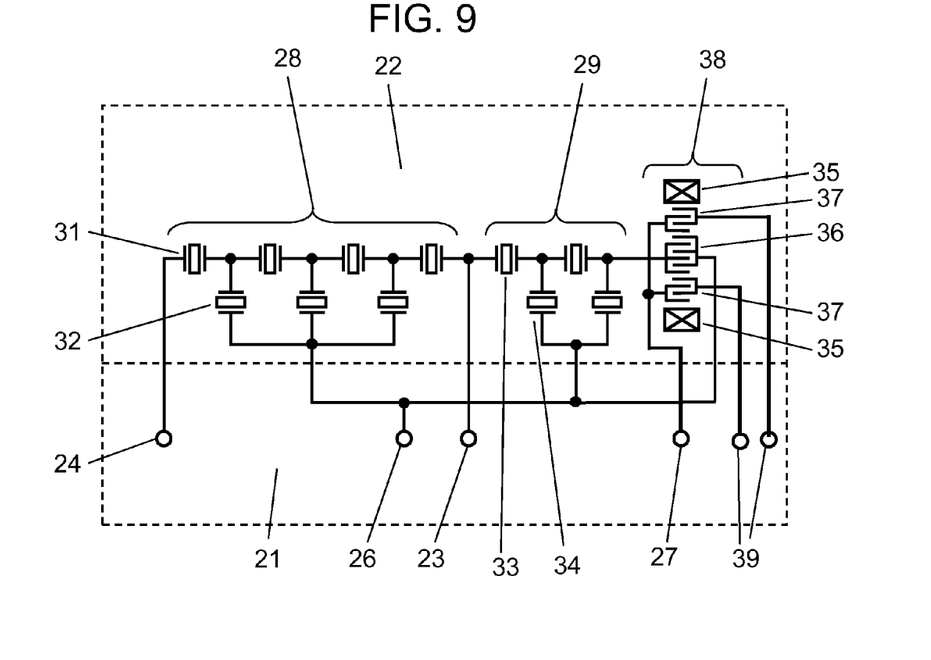
FIG. 9 is a circuit diagram of yet another elastic wave filter device according to the second embodiment of the present invention.

As shown in FIG. 9, the ground side of input IDT 36 may be connected to the ground side of filters 28 and 29, and they may be separated from the ground side of output IDT 37. In this case, out-of-band noise components released to first ground electrode 26 can be prevented from flowing into the signal wiring through output IDT 37 of wave filter 38.

Consequently, the ground side of input IDT 36 may be separated from that of parallel arm resonators 32 and 34; the ground side of output IDT 37 may be separated from that of parallel arm resonators 32 and 34.

The above-described effect is particularly noticeable when filters 28 and 29 and filter 38 are serially connected to function as one filter circuit, thereby improving the common-mode passing characteristics of an imbalance/balance conversion type elastic wave filter device.

The above-described effect is further noticeable when the ground side of filters 28 and 29 is electrically separated from the ground side of filter 38 in the entire elastic wave filter device including panel 21 as well as chip 22. This arrangement further improves the common-mode passing characteristics of the elastic wave filter device.

Figure 10:
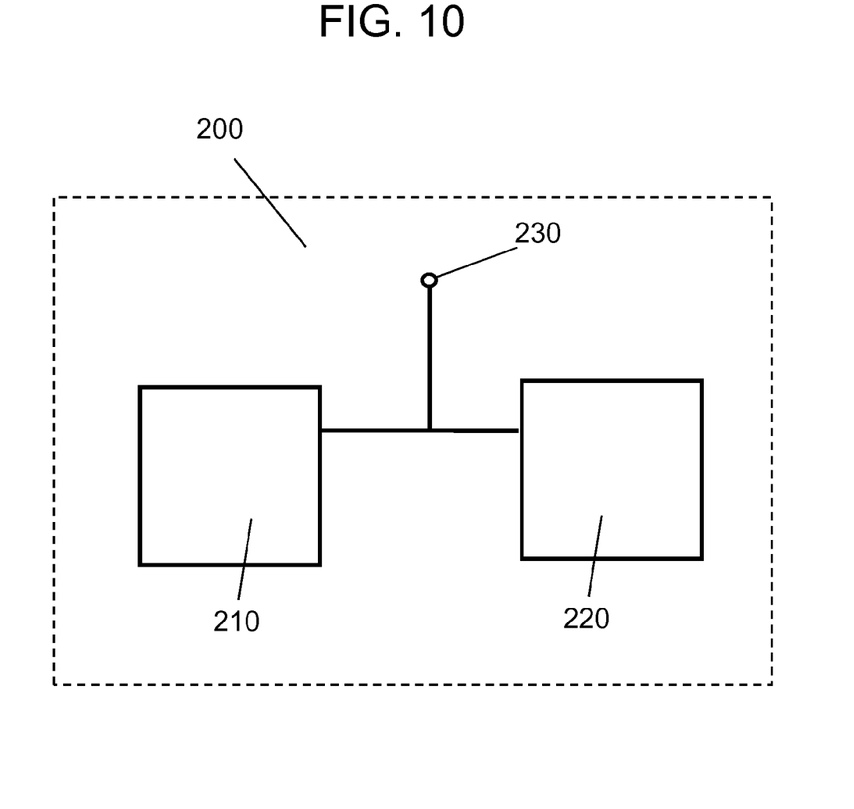
FIG. 10 is a block diagram of an antenna duplexer according to the second embodiment of the present invention.

FIG. 10 is a block diagram of antenna duplexer 200 according to the second exemplary embodiment of the present invention. Antenna duplexer 200 includes an elastic wave filter device of this embodiment as transmission filter 210 and receiving filter 220, and shares antenna terminal 230. Ladder-type elastic wave filters 28 and 29 and longitudinally coupled resonator-type elastic wave filter 38 of this embodiment, applied to antenna duplexer 200, provides an antenna duplexer with superior common-mode passing characteristics.

Then, preferably the ground side of filter 28 forming the transmission-side filter is electrically connected to the ground side of filter 29 forming a part of the receiving-side filter. This prevents influence of parasitic inductors added to resonators 32 and 34, thereby further improving the characteristics of the elastic wave filter device.

Industrial Applicability

An elastic wave filter device of the present invention prevents influence of parasitic components, thereby representing favorable filter characteristics. The device is useful for a high-frequency filter and an antenna duplexer mainly used for mobile communication equipment.

REFERENCE MARKS IN THE DRAWINGS 1, 21 Panel
2, 22 Chip
3, 23 Common terminal
4, 24 Transmission-side terminal
5, 25, 39 Receiving-side terminal
26 First ground electrode
27 Second ground electrode
7, 8, 28, 29 Ladder-type elastic wave filter
9, 30, 38 Longitudinally coupled resonator-type elastic wave filter
10, 12, 31, 33 Series arm resonator
11, 13, 32, 34 Parallel arm resonator
15, 36 Input IDT
16, 37 Output IDT
100, 200 Antenna duplexer
110, 210 Transmission filter
120, 220 Receiving filter
130, 230 Antenna terminal

The invention claimed is:

1. An elastic wave filter device comprising:
a longitudinally coupled resonator-type elastic wave filter formed on a piezoelectric substrate and including an input IDT and an output IDT;
a ladder-type elastic wave filter formed on the piezoelectric substrate and connected to the longitudinally coupled resonator-type elastic wave filter, the ladder-type elastic wave filter including a plurality of series arm resonators and a plurality of parallel arm resonators;

a first ground electrode connected to each of the parallel arm resonators and to one of the input IDT and the output IDT; and a second ground electrode connected to the other of the input IDT and the output IDT, the first ground electrode being electrically separated from the second ground electrode.

2. The elastic wave filter device of claim 1 wherein the first ground electrode is electrically separated from the second ground electrode above the piezoelectric substrate.

3. The elastic wave filter device of claim 1 wherein the ladder-type elastic wave filter and the longitudinally coupled resonator-type elastic wave filter are serially connected to function as a single high-frequency filter.

4. The elastic wave filter device of claim 1 wherein the longitudinally coupled resonator-type elastic wave filter is of an imbalance/balance conversion type.

5. An antenna duplexer comprising:
a transmission filter;
a receiving filter; and
an antenna terminal,
said transmission filter and said receiving filter each including the elastic wave filter device of claim 1.

6. The elastic wave filter device of claim 1 wherein the first ground electrode is connected to the output IDT and the second ground electrode is connected to the input IDT.

7. The elastic wave filter device of claim 1 wherein the first ground electrode is connected to the input IDT and the second ground electrode is connected to the output IDT.

8. An elastic wave filter device comprising:
a longitudinally coupled resonator-type elastic wave filter formed on a piezoelectric substrate and including an input IDT and an output IDT;
a first ladder-type elastic wave filter formed on the piezoelectric substrate and serially connected to the longitudinally coupled resonator-type elastic wave filter, the first ladder-type elastic wave filter including a plurality of first series arm resonators and a plurality of first parallel arm resonators;
a second ladder-type elastic wave filter formed on the piezoelectric substrate and serially connected to the first ladder-type elastic wave filter, the second ladder-type elastic wave filter including a plurality of second series arm resonators and a plurality of second parallel arm resonators;
a first ground electrode connected to each of the first and second parallel arm resonators and to one of the input IDT and the output IDT; and
a second ground electrode connected to the other of the input IDT and the output IDT, the first ground electrode being electrically separated from the second ground electrode.

9. The elastic wave filter device of claim 8 wherein the longitudinally coupled resonator-type elastic wave filter further includes a pair of reflectors, the input IDT and the output IDT being positioned between the reflectors.

10. The elastic wave filter device of claim 8 wherein the first ground electrode is electrically separated from the second ground electrode above the piezoelectric substrate.

11. The elastic wave filter device of claim 8 wherein the first ground electrode is connected to the output IDT and the second ground electrode is connected to the input IDT.

12. The elastic wave filter device of claim 8 wherein the first ground electrode is connected to the input IDT and the second ground electrode is connected to the output IDT.

13. The elastic wave filter device of claim 8 wherein the longitudinally coupled resonator-type elastic wave filter is of an imbalance/balance conversion type.

14. The elastic wave filter device of claim 13 further comprising:
a transmission-side terminal connected to a first one of the plurality of second series arm resonators;
a common terminal serially connected between the first ladder-type elastic wave filter and the second ladder-type elastic wave filter; and
a receiving-side terminal connected to the output IDT, the first ladder-type elastic wave filter and the longitudinally coupled resonator-type elastic wave filter being serially connected between the common terminal and the receiving-side terminal 15. The elastic wave filter device of claim 14 wherein the receiving-side terminal includes a pair of balanced terminals.

16. The elastic wave filter device of claim 15 wherein the first ground electrode is connected to the output IDT and the second ground electrode is connected to the input IDT.

17. The elastic wave filter device of claim 15 wherein the first ground electrode is connected to the input IDT and the second ground electrode is connected to the output IDT.

18. The elastic wave filter device of claim 14 further comprising a panel, the panel including the common terminal, and the piezoelectric substrate being attached to the panel.

19. An antenna duplexer comprising:
an antenna terminal;
a transmission filter connected to the antenna terminal; and
a receiving filter connected to the antenna terminal, the transmission filter and the receiving filter each including the elastic wave filter device of claim 8.

20. An elastic wave filter device comprising:
a longitudinally coupled resonator-type elastic wave filter formed on a piezoelectric substrate and including a first reflector, a second reflector, an input IDT, and an output IDT, the input IDT and the output IDT positioned between the first and second reflectors;
a receiving-side terminal connected to the output IDT;
a common terminal;
a first ladder-type elastic wave filter formed on the piezoelectric substrate and connected to the longitudinally coupled resonator-type elastic wave filter, the first ladder-type elastic wave filter including a plurality of first series arm resonators serially connected between the common terminal and the input IDT, and a plurality of first parallel arm resonators;
a transmission-side terminal;
a second ladder-type elastic wave filter formed on the piezoelectric substrate and connected to the first ladder-type elastic wave filter, the second ladder-type elastic wave filter including a plurality of second series arm resonators serially connected between the transmission-side terminal and the common terminal, and a plurality of second parallel arm resonators, the second ladder-type elastic wave filter, the first ladder-type elastic wave filter, and the longitudinally coupled resonator-type elastic wave filter serially connected between the transmission-side terminal and the receiving-side terminal to function as a single high-frequency filter;
a first ground electrode connected to each of the first and second parallel arm resonators and to one of the input IDT and the output IDT; and
a second ground electrode connected to the other of the input IDT and the output IDT, the first ground electrode being electrically separated from the second ground electrode.

* * * * *